United States Patent
Peng et al.

(10) Patent No.: US 11,901,286 B2
(45) Date of Patent: Feb. 13, 2024

(54) DIAGONAL VIA PATTERN AND METHOD

(71) Applicant: TAIWAN SEMICONDUCTOR MANUFACTURING COMPANY, LTD., Hsinchu (TW)

(72) Inventors: Shih-Wei Peng, Hsinchu (TW); Chih-Min Hsiao, Hsinchu (TW); Ching-Hsu Chang, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 131 days.

(21) Appl. No.: 17/334,320

(22) Filed: May 28, 2021

(65) Prior Publication Data
US 2022/0237357 A1 Jul. 28, 2022

Related U.S. Application Data

(60) Provisional application No. 63/142,867, filed on Jan. 28, 2021.

(51) Int. Cl.
*H01L 23/00* (2006.01)
*H01L 23/522* (2006.01)
(Continued)

(52) U.S. Cl.
CPC ........... *H01L 23/5226* (2013.01); *G03F 1/42* (2013.01); *G06F 30/392* (2020.01);
(Continued)

(58) Field of Classification Search
CPC ........... H01L 23/5226; H01L 21/76816; H01L 21/76877; H01L 23/528; H01L 27/0207;
(Continued)

(56) References Cited

U.S. PATENT DOCUMENTS 6,037,547 A * 3/2000 Blish, II ............... H05K 1/115
174/265
7,081,672 B1 * 7/2006 Govind .................. H01L 23/50
257/E23.079
(Continued)

FOREIGN PATENT DOCUMENTS

CN 1520565 8/2004
CN 111129000 5/2020
(Continued)

OTHER PUBLICATIONS

Article "A Heuristic Approach to Fix Design Rule Check (DRC) Violations in ASIC Designs @7nm Fin FET Technology", Aug. 19, 2020, pp. 1-20.*

*Primary Examiner* — Naum Levin
(74) *Attorney, Agent, or Firm* — Hauptman Ham, LLP

(57) ABSTRACT

A method of generating an integrated circuit (IC) layout diagram includes obtaining a grid of intersecting first and second pluralities of tracks corresponding to adjacent metal layers, determining that first and second pitches of the respective first and second pluralities of tracks conform to a first rule, applying a via positioning pattern to the grid whereby via regions are restricted to alternating diagonal grid lines, positioning via regions at some or all of the grid intersections of the alternating diagonal grid lines, and generating the IC layout diagram including the via regions positioned along the alternating diagonal grid lines.

20 Claims, 15 Drawing Sheets

(51) Int. Cl.
    *G06F 30/392*     (2020.01)
    *G06F 30/394*     (2020.01)
    *G03F 1/42*     (2012.01)
    *H01L 23/528*     (2006.01)
    *G06F 30/31*     (2020.01)
    *H01L 21/768*     (2006.01)

(52) U.S. Cl.
    CPC ............ *G06F 30/394* (2020.01); *G06F 30/31* (2020.01); *H01L 21/76816* (2013.01); *H01L 21/76877* (2013.01); *H01L 23/528* (2013.01)

(58) Field of Classification Search
    CPC ...... G06F 30/392; G06F 30/394; G06F 30/31; G06F 30/398; G03F 1/36; G03F 1/42
    See application file for complete search history.

(56) References Cited

U.S. PATENT DOCUMENTS

| | | | |
|---|---|---|---|
| 7,124,389 B2 * | 10/2006 | Igarashi | H01L 23/5226 |
| | | | 257/E23.145 |
| 7,260,442 B2 | 8/2007 | Yu et al. | |
| 7,285,487 B2 * | 10/2007 | DeHon | H03K 19/17796 |
| | | | 370/380 |
| 7,480,885 B2 * | 1/2009 | Frankle | G06F 30/394 |
| | | | 716/135 |
| 8,381,139 B2 * | 2/2013 | Lin | G06F 30/392 |
| | | | 716/52 |
| 8,661,392 B2 * | 2/2014 | Quandt | H01L 21/823475 |
| | | | 716/135 |
| 9,140,976 B2 * | 9/2015 | Hsieh | G03F 1/36 |
| 9,213,233 B2 | 12/2015 | Chang et al. | |
| 9,256,709 B2 | 2/2016 | Hwang et al. | |
| 9,305,834 B1 * | 4/2016 | Latypov | G03F 7/0002 |
| 10,521,545 B2 * | 12/2019 | Wang | G03F 1/36 |
| 10,628,551 B2 * | 4/2020 | Huda | G06F 30/398 |
| 10,676,349 B1 * | 6/2020 | Grosjean | H03H 3/0076 |
| 10,691,864 B2 | 6/2020 | Wang et al. | |
| 10,776,556 B2 * | 9/2020 | Mikuni | G06F 30/394 |
| 10,878,165 B2 * | 12/2020 | Chang | G06F 30/394 |
| 10,886,173 B2 * | 1/2021 | Clark | H01L 21/67276 |
| 10,892,223 B2 * | 1/2021 | Schenker | H01L 23/53295 |
| 10,963,609 B2 * | 3/2021 | Lin | G06F 30/398 |
| 11,068,640 B2 * | 7/2021 | Kumar | H01L 23/5226 |
| 11,139,245 B1 * | 10/2021 | Peng | H01L 23/5286 |
| 11,171,089 B2 * | 11/2021 | Peng | G06F 30/394 |
| 11,574,901 B2 * | 2/2023 | Peng | H01L 21/823475 |
| 2014/0040838 A1 | 2/2014 | Liu et al. | |
| 2015/0278429 A1 | 10/2015 | Chang | |
| 2018/0197812 A1 | 7/2018 | Or-Bach et al. | |
| 2020/0134128 A1 | 4/2020 | Peng et al. | |
| 2022/0035982 A1 * | 2/2022 | Lin | G06F 30/347 |

FOREIGN PATENT DOCUMENTS

| | | | |
|---|---|---|---|
| DE | 112020007228 T5 * | 3/2023 | ............ H01L 21/56 |
| TW | 200501322 | 1/2005 | |
| TW | 200924163 | 6/2009 | |
| TW | 201103116 | 1/2011 | |
| TW | 202002206 | 1/2020 | |

* cited by examiner

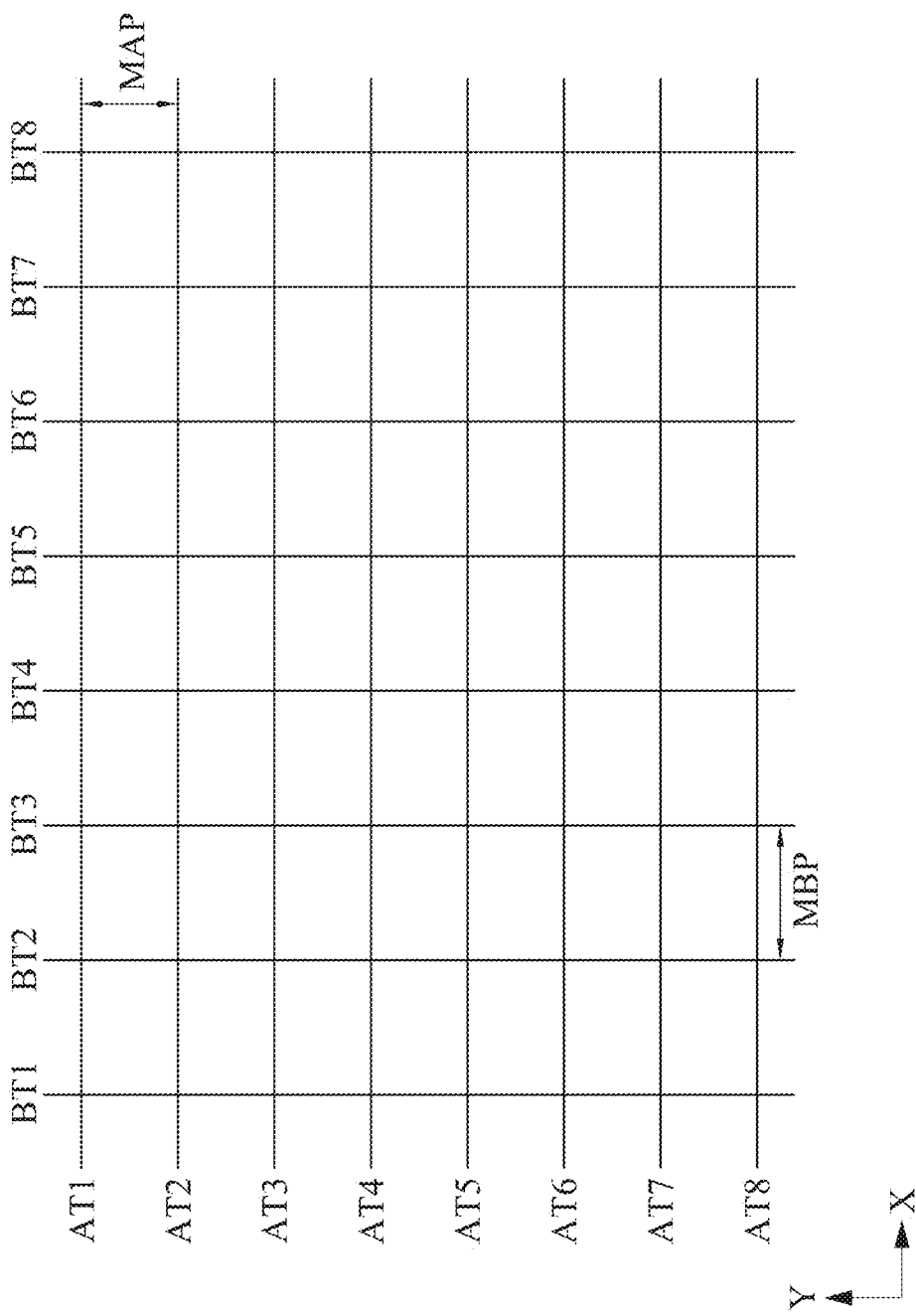

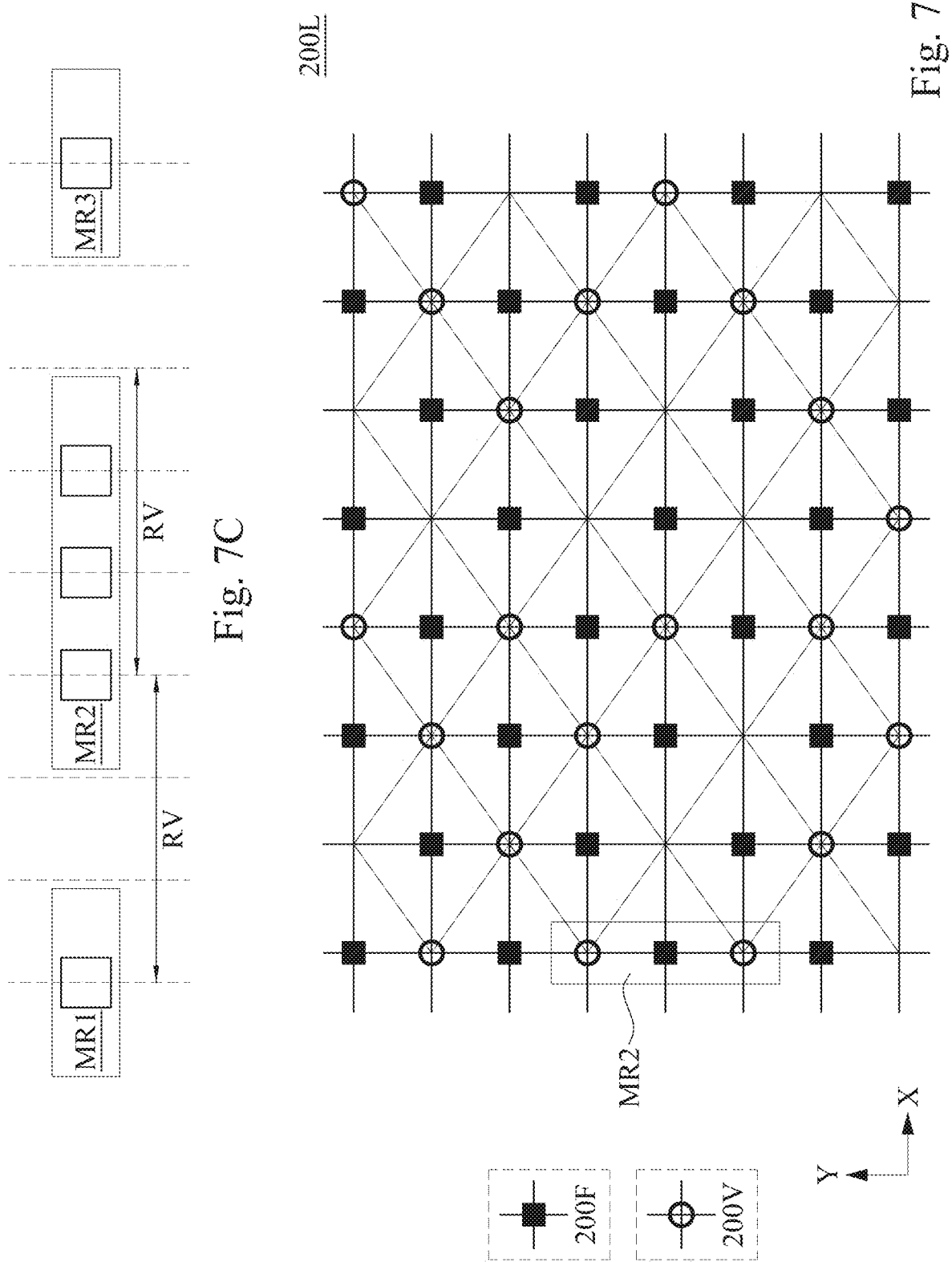

DIAGONAL VIA PATTERN AND METHOD

PRIORITY CLAIM

The present application claims the priority of U.S. Provisional Application No. 63/142,867, filed Jan. 28, 2021, which is incorporated herein by reference in its entirety.

BACKGROUND

The ongoing trend in miniaturizing integrated circuits (ICs) has resulted in progressively smaller devices which consume less power, yet provide more functionality at higher speeds than earlier technologies. An IC typically includes a number of semiconductor devices represented in an IC layout diagram. An IC layout diagram is hierarchical and includes modules which carry out higher-level functions in accordance with the semiconductor device's design specifications. The modules are often built from a combination of cells, each of which represents one or more semiconductor structures configured to perform a specific function.

To form the higher-level modules and enable external connections, cells and other IC features are routed to each other by interconnect structures formed in multiple overlying metal layers. Cell placement and interconnect routing are part of an overall design process for the IC. Various electronic design automation (EDA) tools are used to generate, revise, and verify designs for semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are diagrams of an IC layout diagram, in accordance with some embodiments.

DETAILED DESCRIPTION

Figure 1:
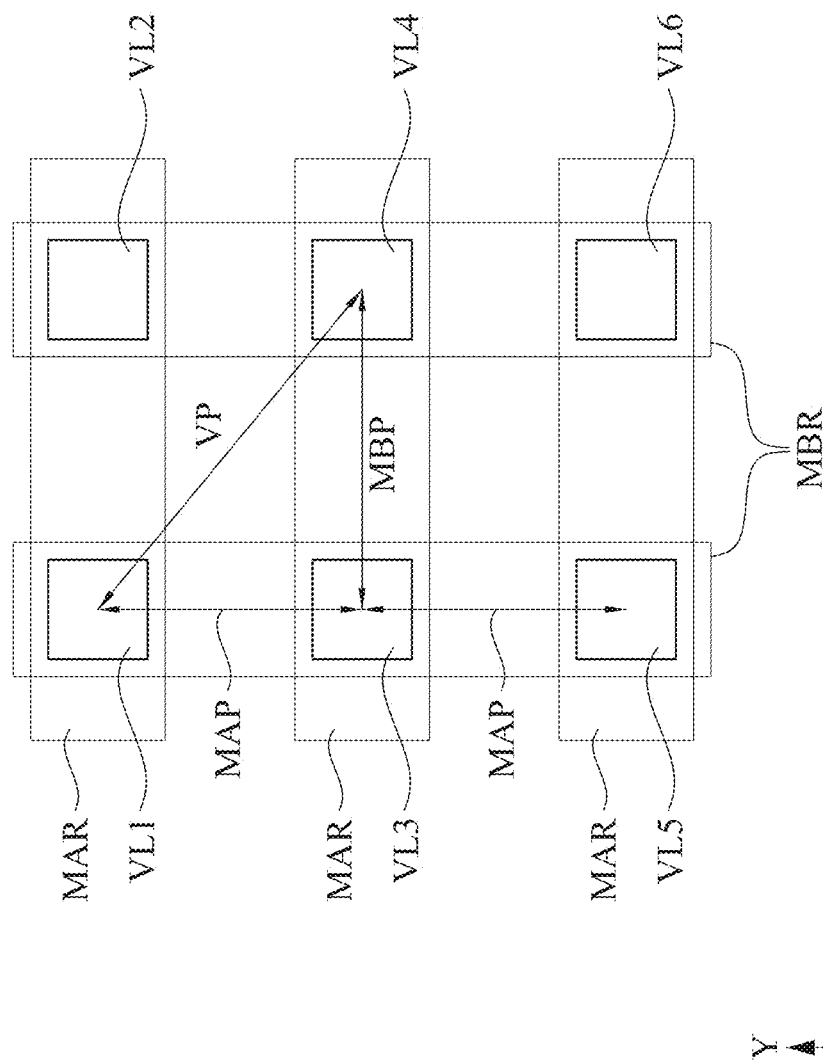
FIG. 1 is a diagram of an IC layout diagram, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, via regions are arranged along alternating diagonal grid lines and empty locations are populated with assist features, thereby forming a continuous diagonal via pattern. Manufacturing processes and IC structures based on IC layout diagrams and masks that include such patterns benefit from pattern uniformity such that yields are improved compared to approaches that are not based on continuous diagonal via patterns. In some embodiments, one or more metal rules are applied to one or both of the metal layers adjacent to the via regions whereby routing efficiency is improved compared to approaches in which such metal rules are not applied.

In the discussion below, FIGS. 1-3 relate to a method of generating an IC layout diagram corresponding to an IC structure including a continuous diagonal via pattern in accordance with some embodiments, FIG. 4 relates to a method of fabricating an IC photo mask including a continuous diagonal via pattern in accordance with some embodiments, FIGS. 5A-6 relate to a method of manufacturing an IC structure including a plurality of via structures in a continuous diagonal via pattern in accordance with some embodiments, FIGS. 7A-9 relate to a method of generating an IC layout diagram including a metal rule in accordance with some embodiments, and FIGS. 10 and 11 relate to systems and a manufacturing flow in accordance with some embodiments.

FIG. 1 is a diagram of an IC layout diagram 100, in accordance with some embodiments. FIG. 1 depicts a plan view of IC layout diagram 100 and X and Y directions. In various embodiments, IC layout diagram 100 is a portion of an IC layout diagram 200L discussed below with respect to FIGS. 2A-2C. In some embodiments, IC layout diagram 100 corresponds to an IC structure manufactured based on IC layout diagram 100.

IC layout diagram 100 includes via locations VL1-VL6. A via location, e.g., a via location V1-V6, is a portion of an IC layout diagram corresponding to an intersection of perpendicular metal tracks (not shown in FIG. 1) of adjacent metal layers, the metal tracks corresponding to locations of metal regions that at least partially define metal segments in the adjacent metal layers.

In the embodiment depicted in FIG. 1, IC layout diagram 100 includes metal regions MAR in a first layer of the adjacent metal layers and metal regions MBR in a second layer of the adjacent metal layers. In some embodiments, metal regions MAR and MBR correspond to a metal region MR1-MR3 discussed below with respect to FIGS. 7A-7D. In some embodiments, metal regions MAR and MBR represent metal segments of an IC structure, e.g., a metal segment Mx discussed below with respect to FIG. 5B, manufactured in accordance with metal regions MAR and MBR.

Each metal track intersection location defines a position at which a via region is capable of being placed. A via region, e.g., a via region 200V discussed below with respect to FIGS. 2A-2D, is a portion of an IC layout diagram capable of at least partially defining an electrical connection between the metal segments of the adjacent metal layers, e.g., a via structure V discussed below with respect to FIG. 5B.

The metal tracks of the first layer of the adjacent metal layers has a track pitch MAP, and the metal tracks of the second layer of the adjacent metal layers has a track pitch MBP greater or less than track pitch MAP. In various embodiments, track pitch MAP corresponds to the first metal layer overlying the adjacent second metal layer and is greater or less than track pitch MBP, or track pitch MBP corresponds to the second metal layer overlying the adjacent first metal layer and is greater or less than track pitch MAP.

The numbers, locations, and relative sizes of metal regions MAR and MBR and via locations V1-V6 depicted in FIG. 1 are non-limiting examples provided for the purpose of illustration. In various embodiments, IC layout diagram 100 includes metal regions MAR and MBR and via locations V1-V6 having numbers, locations, and/or relative sizes other than those depicted in FIG. 1.

Each via location VL1 and VL2 is separated from the corresponding via location VL3 or VL4 in the Y direction by track pitch MAP, each via location VL3 and VL4 is separated from the corresponding via location VL5 or VL6 in the Y direction by track pitch MAP, and each via location VL1, VL3, and VL5 is separated from the corresponding via location VL2, VL4, or VL6 in the X direction by track pitch MBP.

Based on the metal tracks of the adjacent metal layers being perpendicular, each given via location V1-V6, e.g., via location VL1, is separated from each corresponding diagonally adjacent via location VL1-VL6, e.g., VL4, by a distance VP. Distance VP has a value of a hypotenuse of a right triangle including sides corresponding to metal pitches MAP and MBP, given by $$VP=\sqrt{MAP^2+MBP^2}. \qquad (1)$$

Placement of via regions at via locations VL1-VL6 is a function of the values of track pitches MAP and MBP and distance VP relative to spacing limitations related to manufacturing processes used to form vias defined by the via regions. In some embodiments, the manufacturing processes include one or more lithography operations such that the via spacing limitations are based on a wavelength of applied electromagnetic radiation, e.g., extreme ultraviolet (EUV) light, as further discussed below with respect to FIG. 2D.

A given manufacturing process includes a minimum via spacing rule such that all vias are separated by distances greater than or equal to the minimum via spacing rule. In various embodiments, the manufacturing process also includes a via spacing threshold such that no limitations apply to via spacing values greater than the via spacing threshold, and the via spacing limitations apply to via spacing values ranging from the minimum via spacing rule to the via spacing threshold.

Accordingly, in cases in which the lesser of track pitches MAP or MBP is greater than the via spacing threshold value, no via spacing limitations apply, and in cases in which the lesser of track pitches MAP or MBP is within the range from the minimum via spacing rule to the via spacing threshold, the via spacing limitations apply. In some embodiments, the via spacing limitations include via regions having a uniform via spacing.

For both the minimum via spacing rule and the via spacing threshold, decreasing values correspond to decreasing feature sizes of a given manufacturing process, smaller values thereby corresponding to increasingly advanced processes. In some embodiments, the minimum via spacing rule has a value ranging from 20 nanometers (nm) to 50 nm. In some embodiments, the minimum via spacing rule has a value ranging from 35 nm to 40 nm.

In some embodiments, the via spacing threshold has a value ranging from 30 nm to 70 nm. In some embodiments, the via spacing threshold has a value ranging from 40 nm to 50 nm.

In some embodiments, the via spacing limitations include determining a pitch ratio of the greater of track pitches MAP or MBP to the lesser of track pitches MAP or MBP. In the embodiment depicted in FIG. 1, track pitch MBP in the X direction is greater than track pitch MAP in the Y direction. In some embodiments, track pitch MBP in the X direction is less than track pitch MAP in the Y direction. In some embodiments, the Y direction corresponds to a cell height direction as discussed below with respect to FIGS. 7A-9.

In the embodiment depicted in FIG. 1, distance VP having a value twice track pitch MAP corresponds to a distance between via locations VL1 and VL5 having a value equal to distance VP, such that via regions placed at via locations VL1-VL6 separated by either twice track pitch MAP or distance VP have a uniform via spacing. In such a case, Equation 1 becomes $$2MAP=\sqrt{MAP^2+MBP^2}, \qquad (2)$$

such that the pitch ratio of track pitch MBP to track pitch MAP is given by $$MBP/MAP=\sqrt{3}. \qquad (3)$$

Values of the pitch ratio MPB/MAP less than $\sqrt{3}$ (approximately 1.73) correspond to distance VP having a value less than twice track pitch MAP such that via regions placed at via locations VL1-VL6 separated by either twice track pitch MAP or distance VP have a non-uniform via spacing. The pitch ratio, e.g., MBP/MAP, equal to $\sqrt{3}$ thereby corresponds to a ratio threshold below which via regions have a non-uniform via spacing based on placement at via locations VL1-VL6 separated by either twice track pitch MAP or distance VP. In such cases, uniform via spacing is provided by the alternating diagonal grid line embodiments discussed below.

Figure 2B:
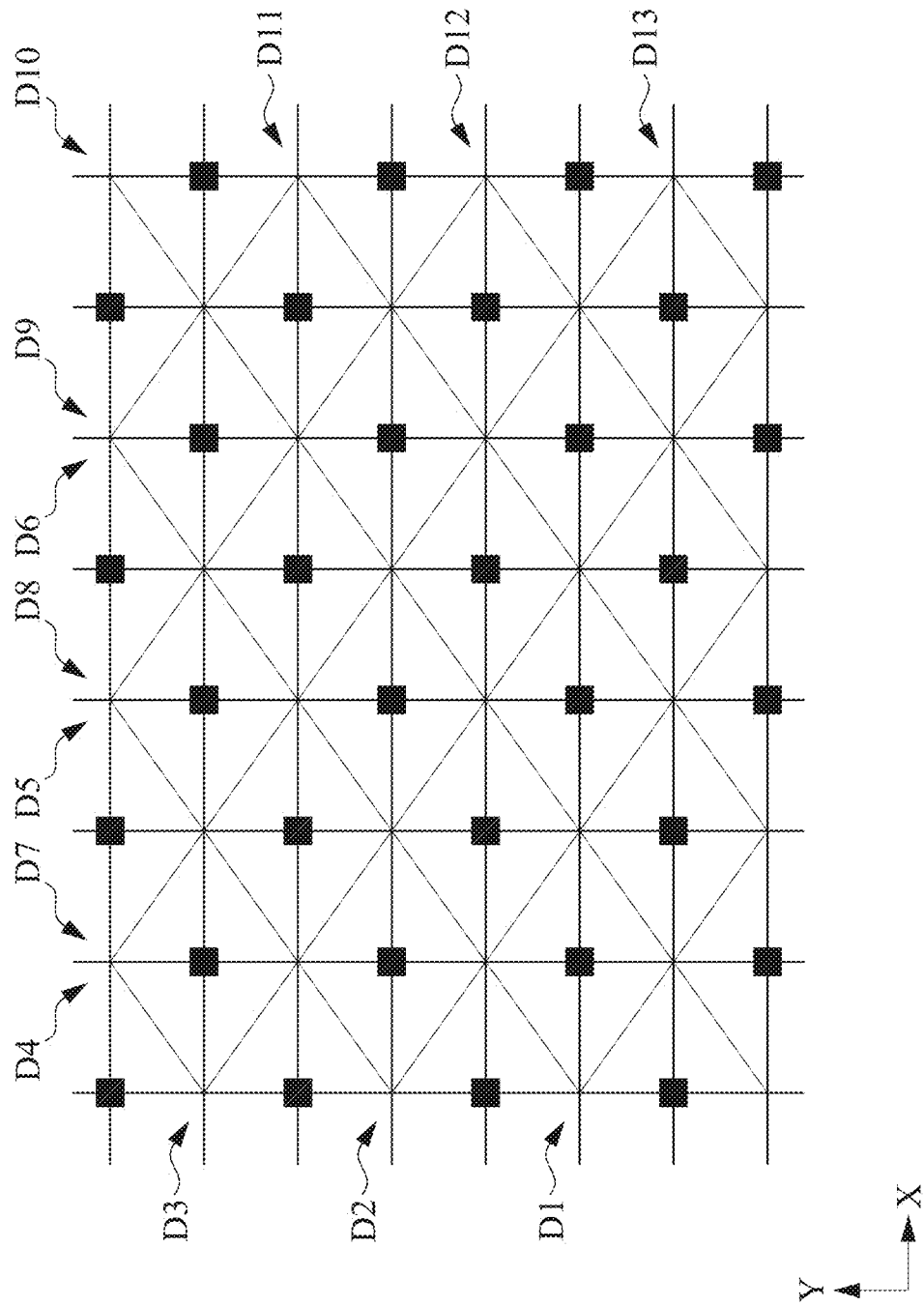
Figure 2C:
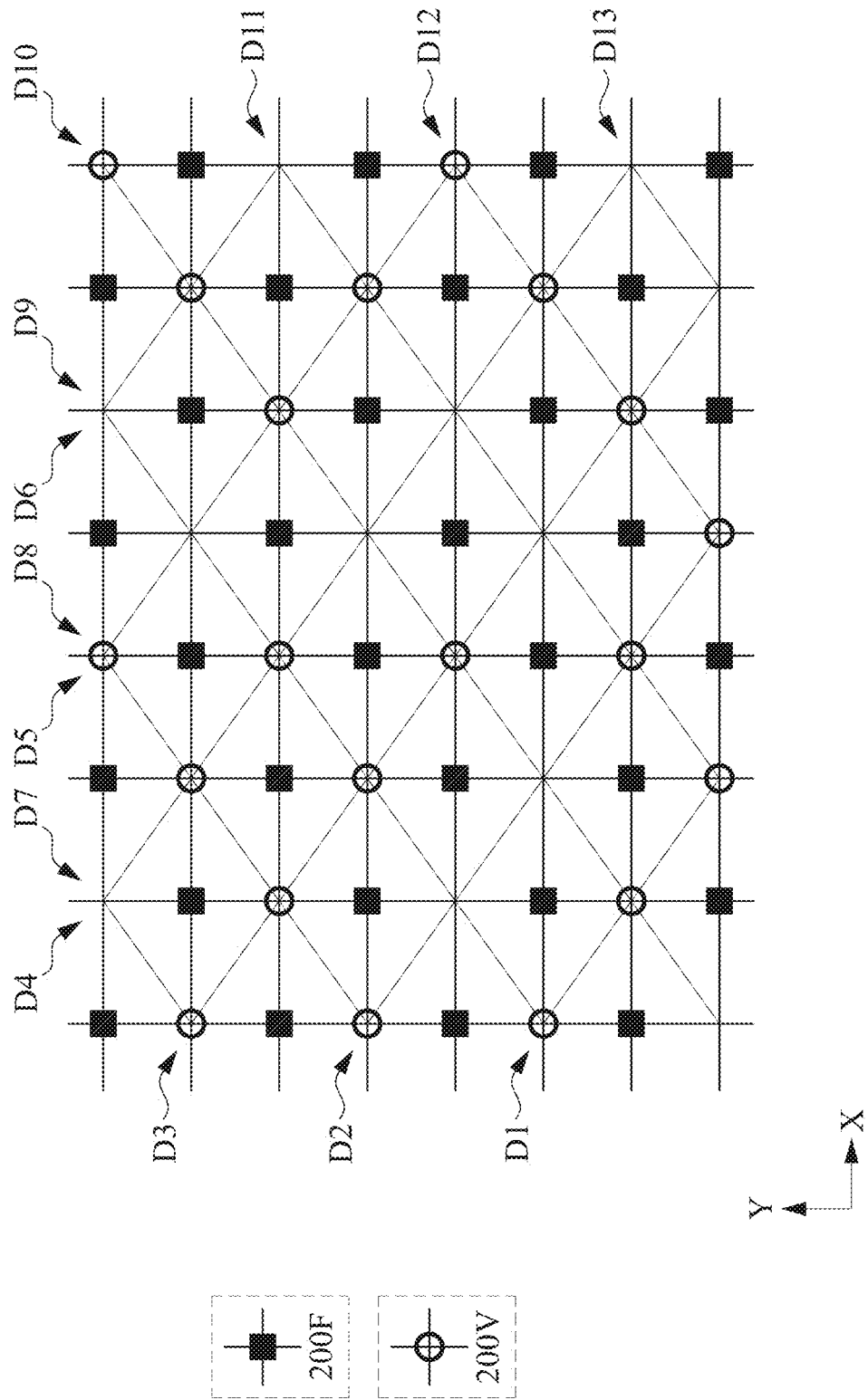
Figure 2D:
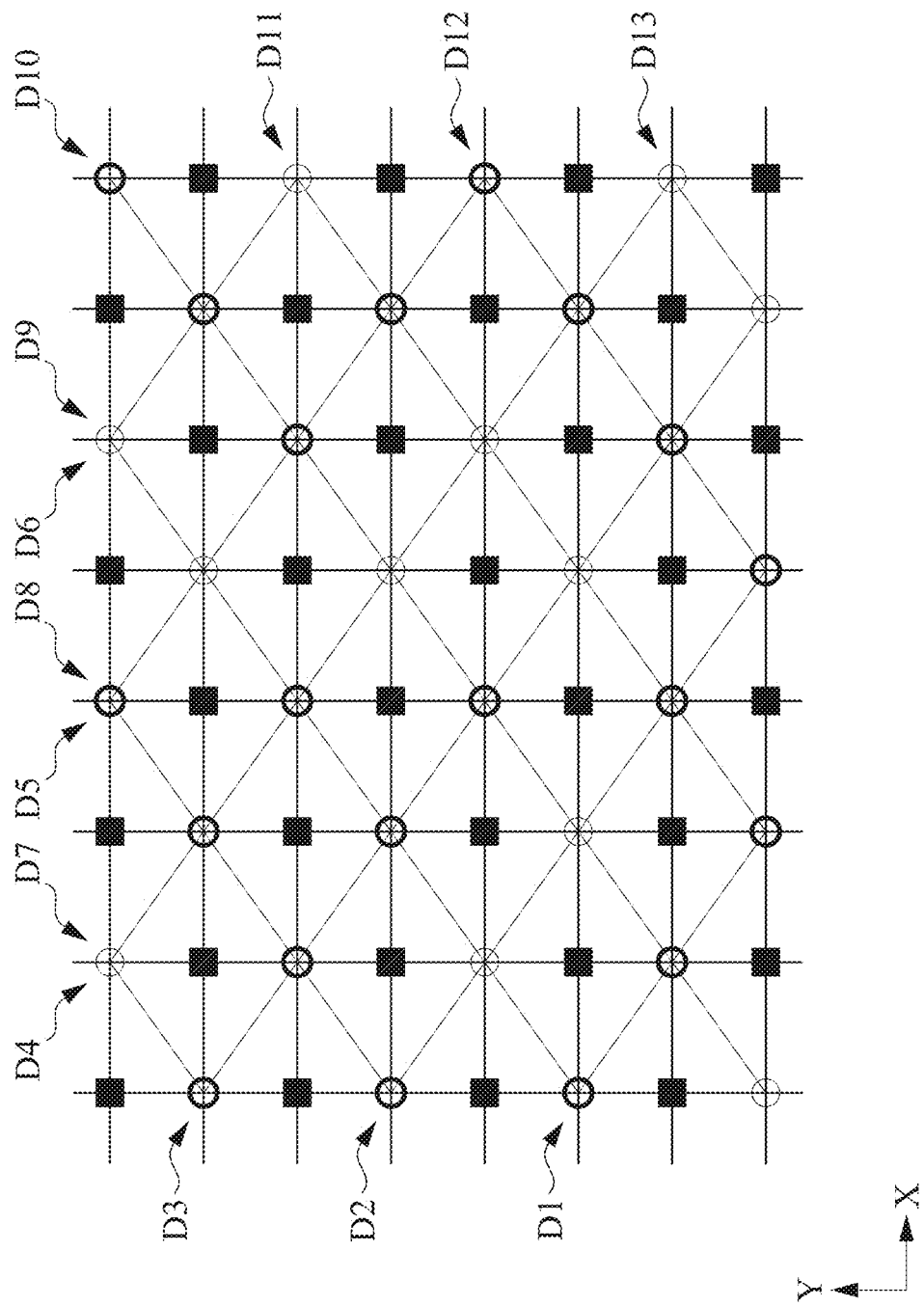
FIG. 2D is a diagram of an IC photo mask, in accordance with some embodiments.

FIGS. 2A-2C are diagrams of IC layout diagram 200L, in accordance with some embodiments, and FIG. 2D is a diagram of an IC photo mask 200M fabricated based on IC layout diagram 200L, in accordance with some embodiments. Each of FIGS. 2A-2D depicts a plan view including the X and Y directions. In some embodiments, IC layout diagram 200L represents an IC structure corresponding to IC layout diagram 200L.

Each of FIGS. 2A-2D includes metal tracks AT1-AT8 having track pitch MAP in the Y direction and metal tracks BT1-BT8 having track pitch MBP in the X direction. Metal tracks AT1-AT8 and BT1-BT8 are labeled only in FIG. 2A for the purpose of illustration. A given portion (not labeled) of each of IC layout diagram 200L depicted in FIGS. 2A-2C and IC photo mask depicted in FIG. 2D thereby corresponds to IC layout diagram 100 discussed above with respect to FIG. 1 such that each intersection of a metal track AT1-AT8 with a metal track BT1-BT8 corresponds to a via location, e.g., a via location VL1-VL6. Via locations VL1-VL6 are not depicted in FIGS. 2A-2D for the purpose of clarity.

The number and orientation of metal tracks AT1-AT8 and BT1-BT8 depicted in FIGS. 2A-2D is a non-limiting example provided for the purpose of illustration. In various embodiments, IC layout diagram 200L and IC photo mask 200M include metal tracks AT1-AT8 and BT1-BT8 having numbers and/or orientations other than those depicted in FIGS. 2A-2D.

As depicted in FIG. 2B, a subset of via locations, e.g., via locations VL1-VL6, includes forbidden positions 200F corresponding to via locations at which via regions are not capable of being placed. Forbidden positions 200F are IC layout diagram regions, e.g., circles or squares, arranged at alternating via locations along each of metal tracks AT1-AT8 and BT1-BT8 such that forbidden positions 200F are aligned along alternating diagonal grid lines (not labeled). The arrangement of forbidden positions 200F thereby limits via locations to the remaining alternating via locations along each of metal tracks AT1-AT8 and BT1-BT8 such that the via locations are aligned along alternating diagonal grid lines D1-D13.

The embodiment depicted in FIG. 2B is a non-limiting example provided for the purpose of illustration. In some embodiments, instead of using forbidden positions 200F to designate the via locations at which via regions are not capable of being placed, other IC layout diagram regions are applied, e.g., elongated regions extending diagonally and positioned to overlap multiple via locations, so as to designate the via locations at which via regions are not capable of being placed.

Diagonal grid lines D1-D6 have a negative slope with respect to the X direction, and diagonal grid lines D7-D13 have a positive slope with respect to the X direction. Diagonal grid lines D1-D6 intersect diagonal grid lines D7-D13 at the via locations remaining after placement of forbidden positions 200F.

As depicted in FIG. 2C, a subset of the remaining via locations includes via regions 200V. In some embodiments, each remaining via location includes a via region 200V. Each via region 200V is positioned at an intersection of one of metal tracks AT1-AT8 with one of metal tracks BT1-BT8 at a location corresponding to an intersection of one of diagonal grid lines D1-D6 with one of diagonal grid lines D7-D13.

In some embodiments, via regions 200V represent via structures, e.g., via structure V discussed below with respect to FIG. 5B, manufactured in accordance with via regions 200V of IC layout diagram 200L.

As depicted in FIG. 2D, IC photo mask 200M includes assist features 200AF positioned at each of the via locations remaining after placement of forbidden positions 200F and via regions 200V as discussed above.

An IC photo mask, e.g., IC photo mask 200M, is a structure configured to form at least a portion of an IC pattern on a semiconductor substrate such as a wafer. The IC photo mask includes a substrate, e.g., a transparent substrate such as fused silica (SiO), quartz, calcium fluoride, or other suitable material. The IC photo mask also includes a photoresist layer including one or more features, e.g., vias, including one or more attenuating materials positioned on the substrate. Non-limiting examples of attenuating materials include one or more of chrome, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$. ZrN, $Al_2O_3N$, $Al_2O_3R$, or other suitable materials.

In various embodiments, an IC photo mask is a binary mask, phase-shift mask, attenuated phase shift mask (at-tPSM), alternating phase shift mask (altRSM), chromeless phase lithography (CPL) mask, or another suitable mask type.

An assist feature, e.g., assist feature 200AF, is a correction feature, e.g., an optical proximity correction (OPC) feature, added to an IC photo mask and configured to perform a resolution enhancement technique (RET). In some embodiments, the assist feature includes one or more attenuating materials or corresponds to a gap in one or more attenuating materials. In some embodiments, the assist feature is a sub-resolution assist feature (SRAF), e.g., having dimensions relative to a wavelength of applied electromagnetic radiation such that the feature is configured to be free from projecting an image onto the semiconductor substrate when the IC photo mask is irradiated. In some embodiments, the assist feature is a phase-shift feature. In some embodiments, the assist feature is also referred as a scattering bar or anti-scattering bar.

In the embodiment depicted in FIG. 2D, metal tracks AT1-AT8 and BT1-BT8, alternating diagonal grid lines D1-D13, and forbidden positions 200F are included for the purpose of illustrating the arrangement of the additional features and are not included in IC photo mask 200M. In FIG. 2D, via regions 200V represent features of IC photo mask 200M in one or more photoresist layers (not labeled).

Because assist features 200AF are positioned at each of the via locations remaining after placement of forbidden positions 200F and via regions 200V, IC photo mask 200M is configured to include via regions 200V and assist features 200AF arranged along alternating diagonal lines corresponding to intersecting metal tracks of adjacent metal layers.

In some embodiments, mask 200M is a mask 1145 discussed below with respect to a mask house 1130 and FIG. 11.

Figure 3:
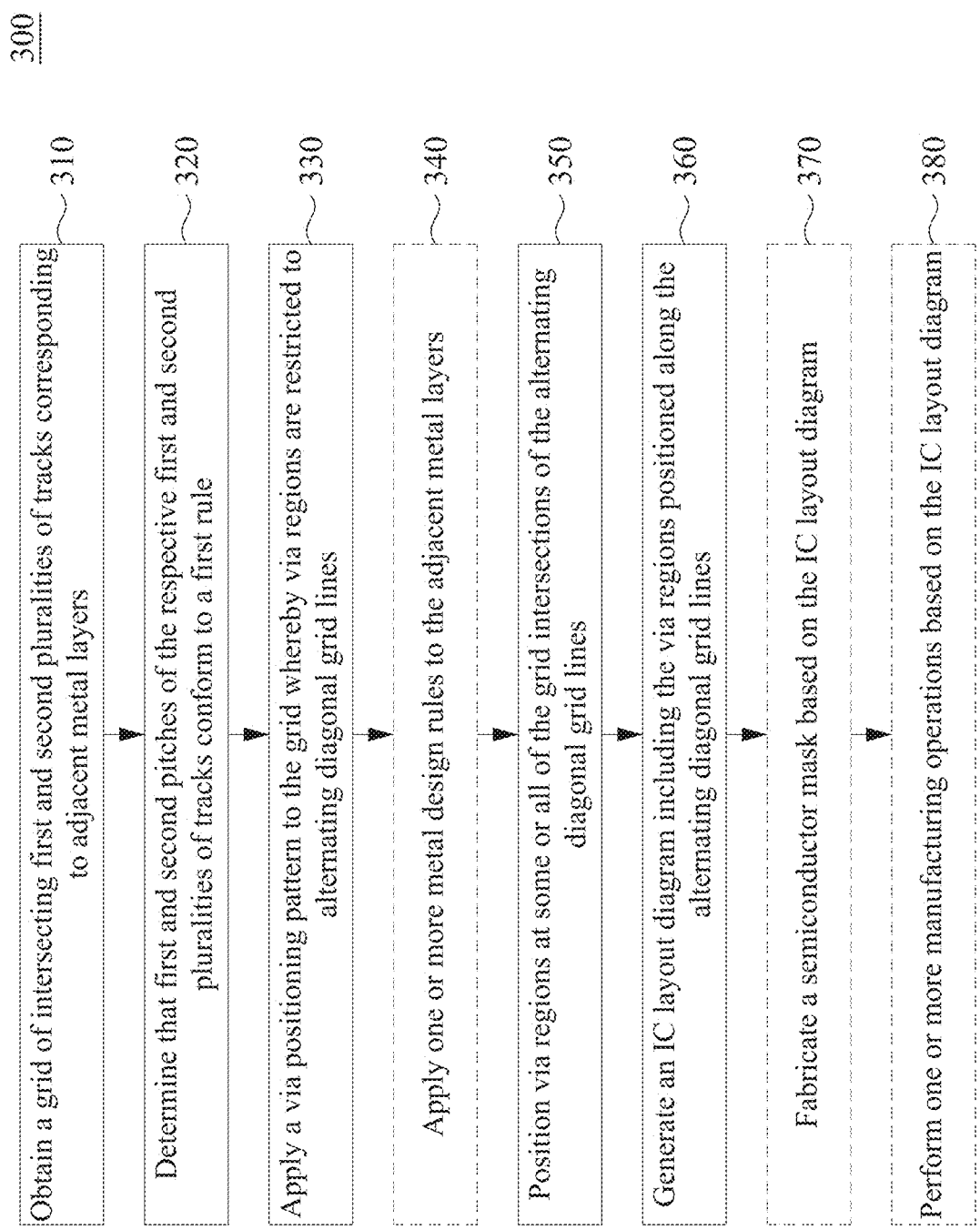
FIG. 3 is a flowchart of a method of generating an IC layout diagram, in accordance with some embodiments.

FIG. 3 is a flowchart of a method 300 of generating an IC layout diagram, in accordance with some embodiments. In some embodiments, generating the IC layout diagram includes generating IC layout diagram 200L discussed above with respect to FIGS. 2A-2C, corresponding to an IC photo mask, e.g., IC photo mask 200M discussed above with respect to FIG. 2D, fabricated based on the generated IC layout diagram.

In some embodiments, some or all of method 300 is executed by a processor of a computer. In some embodiments, some or all of method 300 is executed by a processor 1002 of an IC design system 1000, discussed below with respect to FIG. 10.

Some or all of the operations of method 300 are capable of being performed as part of an automated placement and routing (APR) method, e.g., an APR method performed by an APR system, e.g., IC design system 1000 discussed below with respect to FIG. 10. Some or all of the operations of method 300 are capable of being performed as part of a design procedure performed in a design house, e.g., a design house 1120 discussed below with respect to FIG. 11.

In some embodiments, the operations of method 300 are performed in the order depicted in FIG. 3. In some embodiments, the operations of method 300 are performed simultaneously and/or in an order other than the order depicted in FIG. 3. In some embodiments, one or more operations are performed before, between, during, and/or after performing one or more operations of method 300.

At operation 310, in some embodiments, a grid of intersecting first and second pluralities of tracks corresponding to adjacent metal layers is obtained. The first plurality of tracks has a first pitch in a first direction, e.g., the X direction, and the second plurality of tracks has a second pitch in a second direction perpendicular to the first direction, e.g., the Y direction. In some embodiments, the first pitch is greater than the second pitch. In some embodiments, the first plurality of tracks corresponds to a metal layer overlying the adjacent metal layer or the second plurality of tracks corresponds to a metal layer overlying the adjacent metal layer.

In some embodiments, obtaining the grid of intersecting first and second pluralities of tracks includes obtaining metal tracks BT1-BT8 having track pitch MBP in the X direction and metal tracks AT1-AT8 having track pitch MAP, discussed above with respect to FIGS. 1-2D.

In some embodiments, obtaining the grid of intersecting first and second pluralities of tracks includes obtaining a set of design rules corresponding to one or more manufacturing processes. In some embodiments, obtaining the grid of intersecting first and second pluralities of tracks includes obtaining the grid corresponding to one or more cells having one or more cell heights along the second direction. In some embodiments, obtaining the grid includes obtaining the set of design rules and/or the one or more cells from an IC design storage 1007 discussed below with respect to FIG. 10.

At operation 320, the first and second pitches of the respective first and second pluralities of tracks are determined to conform to a first rule. In some embodiments, determining that the first and second pitches conform to the first rule includes determining that at least one of the first or second pitches is less than or equal to a minimum via spacing rule, e.g., determining that at least one of metal pitches MBP or MAP is less than or equal to a minimum via spacing rule as discussed above with respect to FIG. 1.

In some embodiments, determining that the first and second pitches conform to the first rule includes determining that a ratio of the first pitch to the second pitch is less than a threshold value. In some embodiments, determining that the ratio of the first pitch to the second pitch is less than the threshold value includes determining that the ratio of the first pitch to the second pitch is less than V. In some embodiments, determining that the ratio of the first pitch to the second pitch is less than the threshold value includes determining that the ratio MBP/MAP is less than V as discussed above with respect to FIG. 1.

At operation 330, a via positioning pattern is applied to the grid whereby via regions are restricted to alternating diagonal grid lines. Applying the via positioning pattern includes applying a rule forbidding placing via regions at potential via locations at intersections of the first and second pluralities of tracks. The forbidden via locations are aligned along alternating diagonal grid lines such that via region placement is restricted to the alternating diagonal grid lines left open after applying the forbidden via region rule.

In some embodiments, applying the rule forbidding placing via regions at potential via locations includes arranging forbidden positions 200F at alternating via locations VL1-VL6 at intersections of metal tracks AT1-AT8 and BT1-BT8, thereby limiting via locations to the remaining alternating via locations aligned along alternating diagonal grid lines D1-D13 as discussed above with respect to FIGS. 1-2D.

At operation 340, in some embodiments, one or more metal design rules are applied to one or both of the adjacent metal layers. Applying the one or more metal design rules includes increasing routing flexibility of electrical connections between the adjacent metal layers.

In some embodiments, applying the one or more metal design rules includes dividing one or both of the first or second pluralities of tracks into two track subsets having different pitches. In some embodiments, dividing the first and/or second pluralities of tracks into two track subsets includes performing one or more operations of a method 900, discussed below with respect to FIGS. 7A-9.

In some embodiments, applying the metal design rule includes reducing one or more of an enclosure rule or an end-to-end spacing rule of the metal layer. In some embodiments, reducing the enclosure rule and/or end-to-end spacing rule includes performing one or more operations of method 900, discussed below with respect to FIGS. 7A-9.

At operation 350, via regions are positioned at some or all of the grid intersections of the alternating diagonal grid lines. Positioning the via regions includes at least partially defining electrical connections between metal segments of each of the adjacent metal layers at least partially defined by metal regions. In some embodiments, defining the electrical connections between metal segments of the adjacent metal layers includes positioning the via regions overlapping one or more metal regions positioned based on the one or more metal rules applied in operation 340.

In some embodiments, positioning the via regions includes positioning via regions 200V at some or all of the grid intersections of diagonal grid lines D1-D13 as discussed above with respect to FIGS. 1-2D.

At operation 360, in some embodiments, the IC layout diagram including the via regions positioned along the alternating diagonal grid lines is generated. Generating the IC layout diagram is performed by a processor, e.g., processor 1002 of IC design system 1000 discussed below with respect to FIG. 10.

In some embodiments, generating the IC layout diagram includes storing the IC layout diagram in a storage device, e.g., IC design storage 1007 discussed below with respect to FIG. 10. In some embodiments, storing the IC layout diagram in the storage device includes storing the IC layout diagram over a network, e.g., network 1014 of IC design system 1000 discussed below with respect to FIG. 10.

In various embodiments, generating and/or storing the IC layout diagram includes generating and/or storing IC layout diagram 200L discussed above with respect to FIGS. 1-2D.

At operation 370, in some embodiments, one or more semiconductor masks are fabricated based on the IC layout diagram. Fabricating one or more semiconductor masks is discussed below with respect to IC manufacturing system 1100 and FIG. 11.

In some embodiments, fabricating one or more semiconductor masks includes fabricating IC photo mask 200M discussed above with respect to FIGS. 1-2D. In some embodiments, fabricating one or more semiconductor masks includes performing one or more operations of a method 400 discussed below with respect to FIG. 4.

In some embodiments, fabricating one of one or more semiconductor masks is based on IC layout diagram 200L discussed above with respect to FIGS. 1-2D.

At operation 380, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to IC manufacturing system 1100 and FIG. 11.

In some embodiments, performing one or more manufacturing operations includes performing one or more operations of a method 600 discussed below with respect to FIG. 6.

In some embodiments, performing one or more manufacturing operations is based on IC layout diagram 200L and/or IC photo mask 200M discussed above with respect to FIGS. 1-2D.

By executing some or all of the operations of method 300, an IC layout diagram, e.g., IC layout diagram 200L, is generated including a continuous diagonal via pattern. Manufacturing processes based on such IC layout diagrams benefit from pattern uniformity such that yields are improved compared to approaches that are not based on continuous diagonal via patterns.

Figure 4:
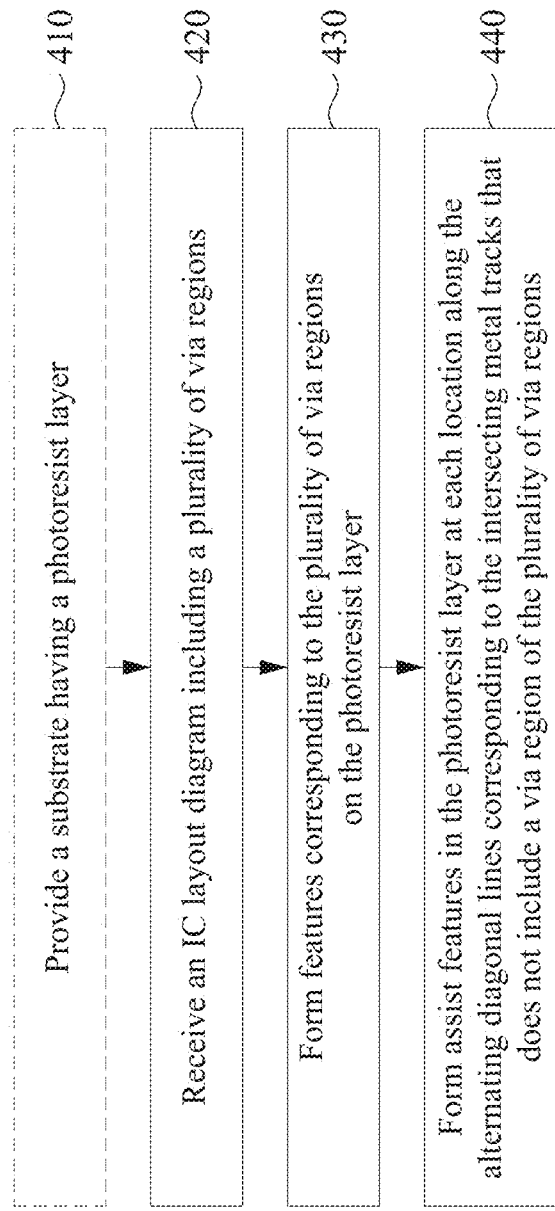
FIG. 4 is a flowchart of a method of fabricating an IC photo mask, in accordance with some embodiments.

FIG. 4 is a flowchart of a method 400 of fabricating an IC photo mask, in accordance with some embodiments. In some embodiments, fabricating an IC photo mask includes fabricating IC photo mask 200M discussed above with respect to FIG. 2D, corresponding to an IC layout diagram, e.g., IC layout diagram 200L discussed above with respect to FIGS. 2A-2C.

In some embodiments, some or all of method 400 is executed by a processor of a computer. In some embodiments, some or all of method 400 is executed by processor 1002 of IC design system 1000, discussed below with respect to FIG. 10.

Some or all of the operations of method 400 are capable of being performed as part of a one or more operations performed in a mask house, e.g., mask house 1130 discussed below with respect to FIG. 11.

In some embodiments, the operations of method 400 are performed in the order depicted in FIG. 4. In some embodiments, the operations of method 400 are performed simultaneously and/or in an order other than the order depicted in FIG. 4. In some embodiments, one or more operations are performed before, between, during, and/or after performing one or more operations of method 400.

At operation 410, in some embodiments, a substrate having a photoresist layer is provided. Providing a substrate having a photoresist layer is performed in accordance with the discussion above with respect to IC photo mask 200M and FIG. 2D, and with the discussion below with respect to mask house 1130 and FIG. 11.

At operation 420, an IC layout diagram is received. The IC layout diagram includes a plurality of via regions arranged along alternating diagonal lines corresponding to intersecting metal tracks of adjacent metal layers. In some embodiments, receiving the IC layout diagram includes receiving IC layout diagram 200L including via regions 200V discussed above with respect to FIGS. 1-2D.

At operation 430, features corresponding to the plurality of via regions are formed on the photoresist layer. In some embodiments, forming the features includes using one or more processes including photoresist deposition, softbaking, mask aligning, exposing (e.g., patterning), baking, developing the photoresist, hard baking, stripping the resist, and/or other processes. In some embodiments, forming the features includes lithography patterning including electron-beam writing, ion-beam writing, mask-less lithography, and/or molecular imprint.

In some embodiments, forming the features corresponding to the plurality of via regions on the photoresist layer includes forming via features corresponding to via regions 200V discussed above with respect to FIGS. 1-2D.

At operation 440, assist features are formed in the photoresist layer at each location along the alternating diagonal lines corresponding to the intersecting metal tracks that does not include a via region of the plurality of via regions. Forming the assist features is performed in the manner discussed above with respect to forming the plurality of via regions at operation 430.

In some embodiments, forming the assist features in the photoresist layer includes forming assist features 200AF discussed above with respect to FIGS. 1-2D.

In some embodiments, forming the assist features in the photoresist layer includes performing a data preparation 1132 discussed below with respect to FIG. 11.

In some embodiments, receiving the IC layout diagram at operation 410 includes receiving the IC layout diagram including via assist regions corresponding to the assist features, and operations 430 and 440 are a same operation including forming both the plurality of via regions and the assist features in the photoresist layer.

By executing some or all of the operations of method 400, an IC photo mask, e.g., IC photo mask 200M, is generated including a continuous diagonal via pattern. Manufacturing processes based on such IC photo masks benefit from pattern uniformity such that yields are improved compared to approaches that are not based on continuous diagonal via patterns.

Figure 5B:
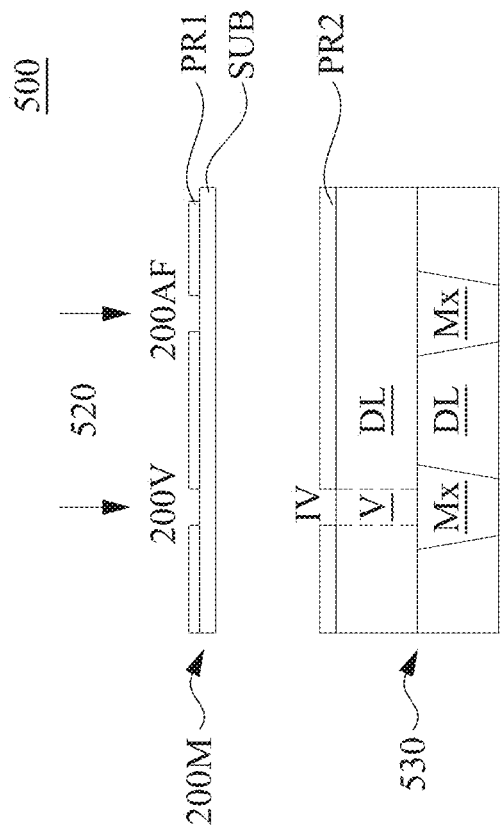
FIGS. 5A and 5B are diagrams of an IC manufacturing system, in accordance with some embodiments.
Figure 5A:
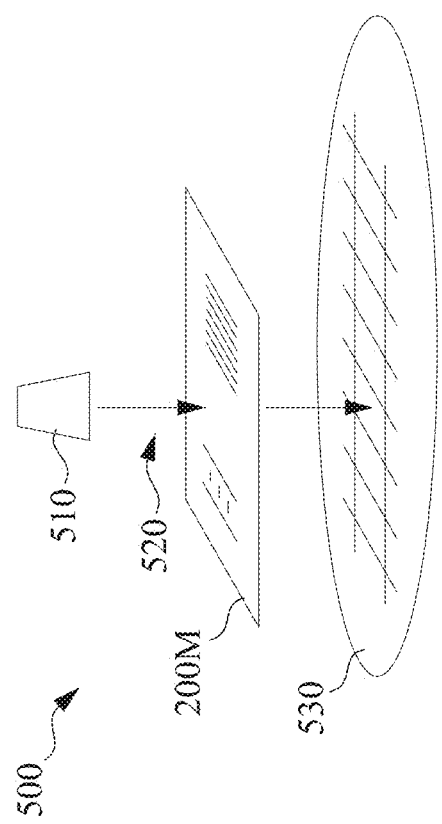

FIGS. 5A and 5B are diagrams of an IC manufacturing system 500, in accordance with some embodiments. FIG. 5A is a top level diagram of IC manufacturing system 500, and FIG. 5B includes details of a portion of IC manufacturing system 500. Each of FIGS. 5A and 5B is simplified for the purpose of illustration. In some embodiments, IC manufacturing system 500 includes one or more features in addition to those depicted in FIGS. 5A and 5B.

IC manufacturing system 500 is configured to perform one or more IC manufacturing processes including IC photo mask 200M discussed above with respect to FIGS. 1-4. As depicted in FIG. 5A, IC manufacturing system 500 includes a radiation source 510 configured to project radiation 520 onto IC photo mask 200M positioned above a semiconductor substrate 530. In various embodiments, radiation source 510 is configured to output radiation 520 including electromagnetic radiation such as UV light, EUV light, or X-rays, an electron beam, or an ion beam.

Semiconductor substrate 530 includes an IC structure manufactured in accordance with IC layout diagram 200L. FIGS. 5A and 5B represent semiconductor substrate 530 at an intermediate manufacturing stage, e.g., prior to construction of metal segments of a second of two adjacent metal layers.

As depicted in FIG. 5B, IC photo mask 200M includes a photoresist layer PR1 positioned on a substrate SUB. Photoresist layer PR1 includes an instance of via region 200V and an instance of assist feature 200AF, each discussed above with respect to FIGS. 1-4. In the embodiment depicted in FIG. 5B, each of via region 200V and assist feature 200AF includes a gap in photoresist layer PR1, the gap corresponding to via region 200V being larger than the gap corresponding to assist feature 200AF. In some embodiments, each of via region 200V and assist feature 200AF includes a portion of photoresist layer PR1, the portion corresponding to via region 200V being larger than the portion corresponding to assist feature 200AF.

Semiconductor substrate 530 includes a lower dielectric layer DL in which two instances of a metal segment Mx are positioned, and an upper dielectric layer DL overlying the lower dielectric layer DL. A photoresist layer PR2 overlies upper dielectric layer DL.

IC photo mask 200M is positioned overlying semiconductor substrate 530 such that each of via region 200V and assist feature 200AF is vertically aligned with a corresponding instance of metal segment Mx. As depicted in FIG. 5B, radiation 520 received by IC photo mask 200M at via region 200V causes an image IV to be formed in photoresist layer PR2, image IV corresponding to a subsequently formed via structure V in the upper dielectric layer DL overlying and contacting an instance of metal segment Mx. Radiation 520 received by IC photo mask 200M at assist feature 200AF does not cause an image to be formed in photoresist layer PR2 and instead assists with the formation of image IV.

Figure 6:
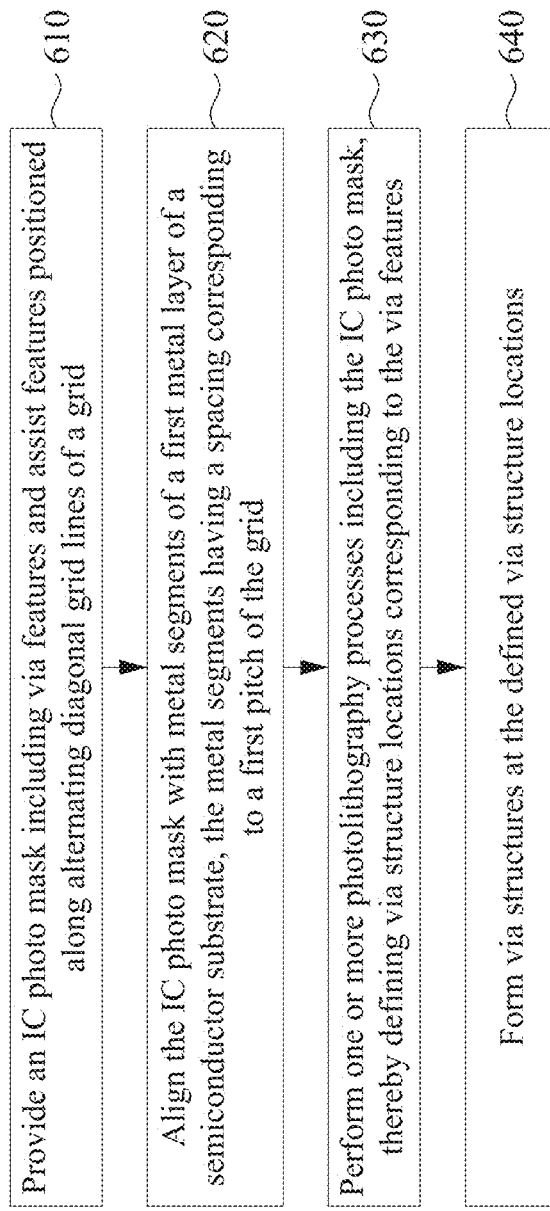
FIG. 6 is a flowchart of a method of manufacturing a plurality of via structures, in accordance with some embodiments.

FIG. 6 is a flowchart of a method 600 of manufacturing a plurality of via structures, in accordance with some embodiments. Method 600 is operable to form the plurality of via structures based on IC photo mask 200M using IC manufacturing system 500 discussed above with respect to FIGS. 5A and 5B.

In some embodiments, the operations of method 600 are performed in the order depicted in FIG. 6. In some embodiments, the operations of method 600 are performed in an order other than the order depicted in FIG. 6. In some embodiments, one or more additional operations are performed before, during, and/or after the operations of method 600. In some embodiments, performing some or all of the operations of method 600 includes performing one or more operations as discussed below with respect to an IC fab 1150 and FIG. 11.

At operation 610, an IC photo mask including via regions and assist features positioned along alternating diagonal grid lines of a grid is provided. In some embodiments, providing the IC photo mask includes providing IC photo mask 200M discussed above with respect to FIGS. 1-5B.

At operation 620, the IC photo mask is aligned with metal segments of a first metal layer of a semiconductor substrate, the metal segments having a spacing corresponding to a first pitch of the grid. In some embodiments, aligning the IC photo mask with metal segments of the first metal layer of the semiconductor substrate includes aligning IC photo mask 200M with instances of metal segments Mx of semiconductor substrate 530 as discussed above with respect to FIGS. 5A and 5B.

At operation 630, one or more photolithography processes including the IC photo mask are performed, thereby defining via structure locations corresponding to the via features. The one or more photolithography processes are performed in accordance with the discussion below with respect to IC fab 1150 and FIG. 11.

Defining the via structure locations includes using the via features of the IC photo mask to cause images to be formed on the semiconductor substrate at the via structure locations, and using the assist features of the IC photo mask to assist forming the images. In some embodiments, using the via and assist features includes using via regions 200V and assist features 200AF of IC photo mask 200M to assist forming images IV as discussed above with respect to FIGS. 1-5B.

At operation 640, via structures are formed at the defined via structure locations. Forming the via structures is performed in accordance with the discussion below with respect to IC fab 1150 and FIG. 11, and includes performing a plurality of manufacturing operations including depositing and patterning one or more photoresist layers, performing one or more etching processes, and performing one or more deposition processes whereby one or more conductive materials are configured to form a continuous, low resistance structure contacting the underlying metal segment.

In some embodiments, forming the via structures includes forming via structures V discussed above with respect to FIGS. 5A and 5B.

In some embodiments, forming the via structures includes forming one or more structures overlying the via structures, e.g., metal segments of a second metal layer adjacent to and overlying the first metal layer including metal segments Mx. In some embodiments, forming the via structures includes forming metal segments and via structures as part of a damascene process.

By executing some or all of the operations of method 600, a manufacturing process based on an IC photo mask including a continuous diagonal via pattern, e.g., IC photo mask 200M, is performed such that the pattern uniformity improves yields compared to approaches that are not based on continuous diagonal via patterns.

Figure 7A:
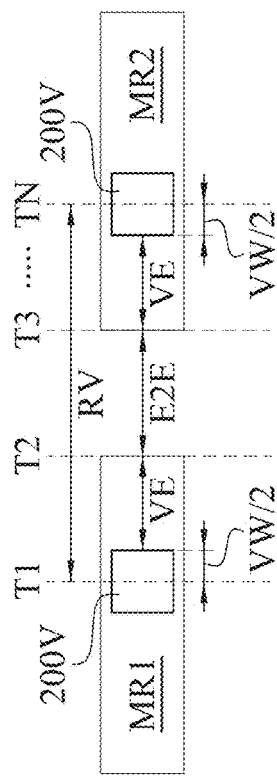
FIGS. 7A-8 are diagrams of metal rules, in accordance with some embodiments.
Figure 7B:
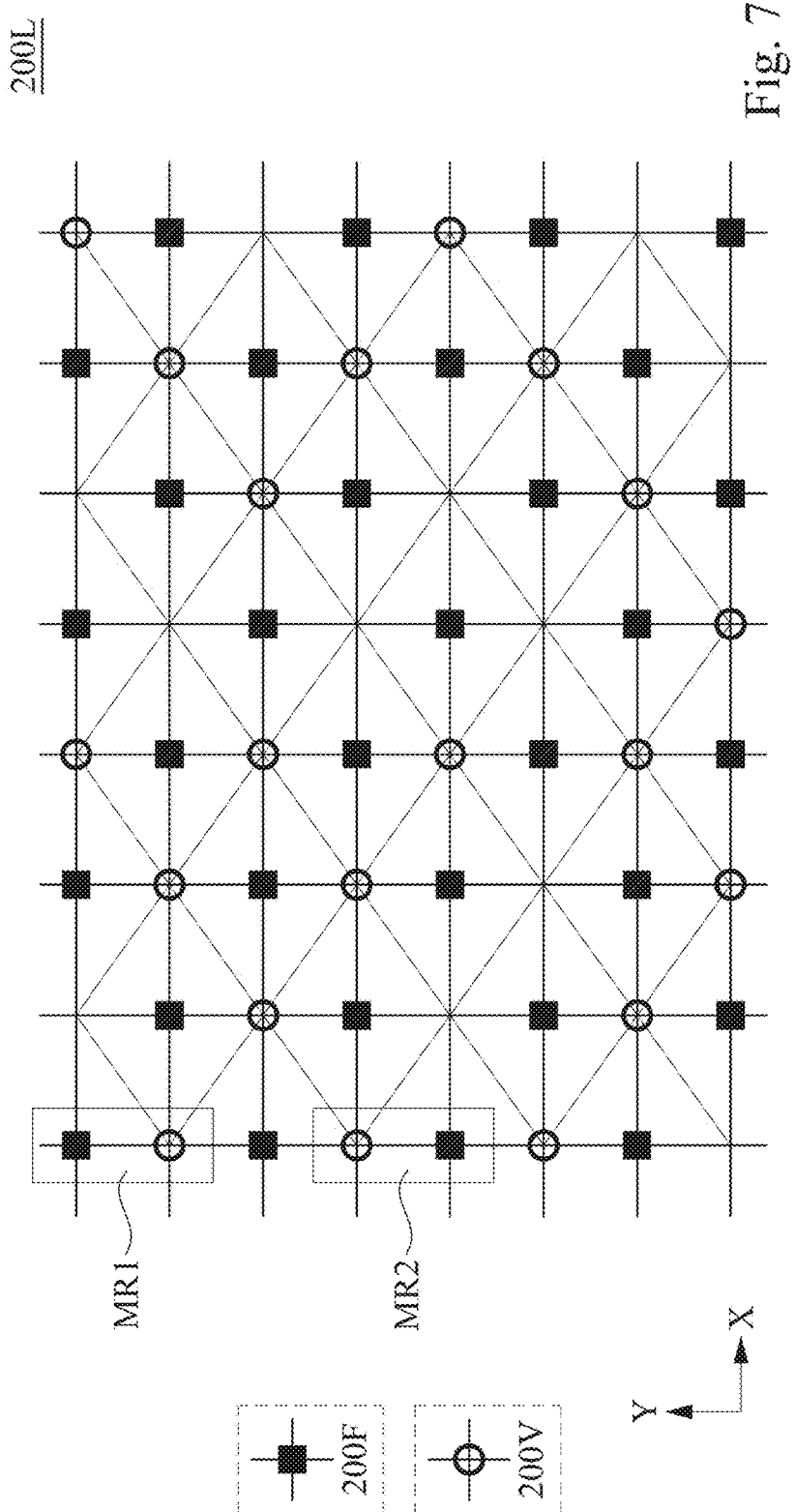
Figure 8:
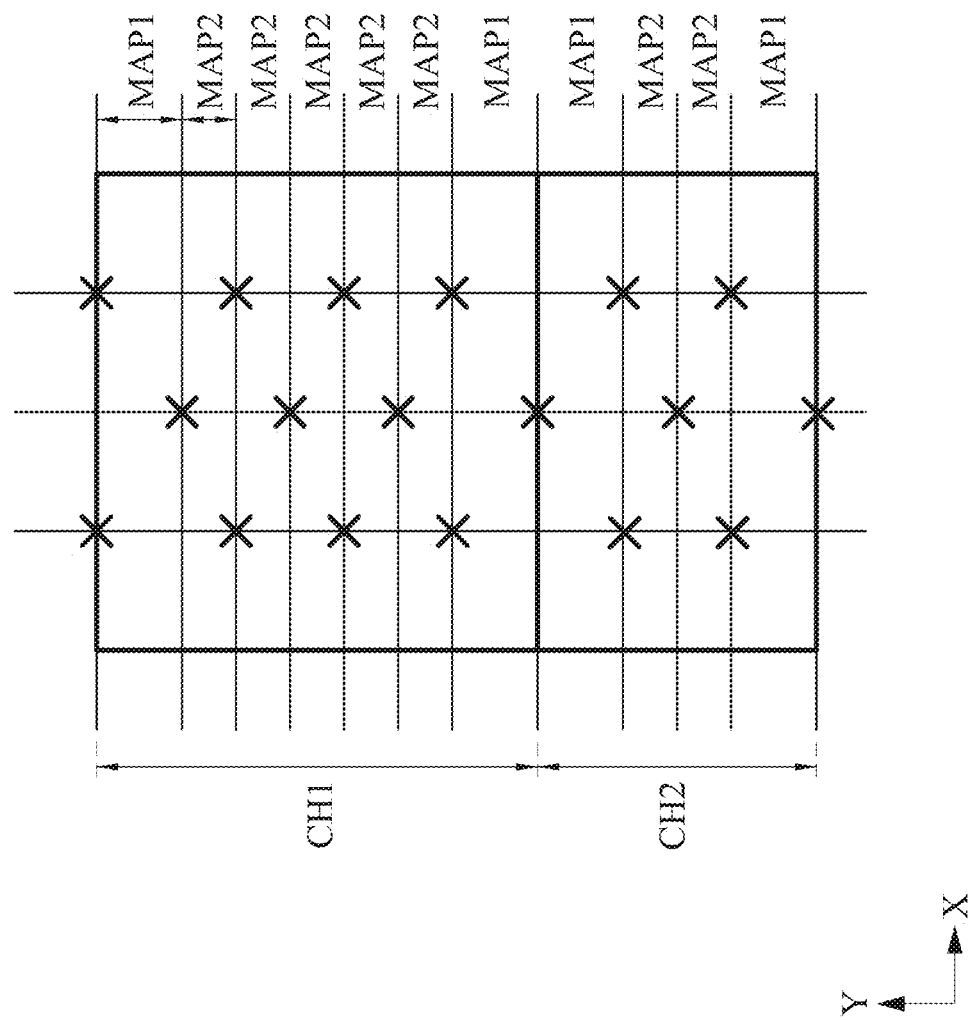

FIGS. 7A-8 are diagrams of metal rules, in accordance with some embodiments. FIGS. 7A and 7B depict embodiments in which a minimum metal line length corresponds to two vias, FIGS. 7C and 7D depict embodiments in which a minimum metal line length corresponds to three vias, and FIG. 8 depicts an embodiment in which a plurality of tracks is divided into two track subsets having different pitches.

FIG. 7A includes tracks T1-TN, metal regions MR1 and MR2, and via regions 200V, discussed above with respect to FIGS. 1-6, centered on corresponding ones of tracks T1-TN. Tracks T1-TN correspond to tracks AT1-AT8 or BT1-BT8 of a first metal layer as discussed above with respect to FIGS. 1-6, and metal regions MR1 and MR2 are metal segments of a second metal layer adjacent to the first metal layer. Metal region MR1 is included in a first net of an IC, and metal region MR2 is included in a second net of the IC.

A distance RV between adjacent via regions 200V is based on a via width VW (twice VW/2 from the center to the edge of via region 200V), a via enclosure VE (from the edge of via region 200V to the edge of metal region MR1 or MR2), and an end-to-end spacing E2E (between edges of metal regions MR1 and MR2), given by $$RV = VW + 2*VE + E2E. \quad (4)$$

In the embodiment depicted in FIG. 7A, distance RV corresponds to a number of tracks N=3.

FIG. 7B depicts metal regions MR1 and MR2 included in IC layout diagram 200L discussed above with respect to FIGS. 1-6. In the embodiment depicted in FIG. 7B, metal regions MR1 and MR2 are positioned such that adjacent via regions 200V are separated by a distance (not labeled) corresponding to the number of tracks N=2.

FIG. 7C includes metal regions MR1 and MR2 arranged as discussed above with respect to FIG. 7A, except that metal segment MR2 includes a total of three access points corresponding to via locations potentially occupied by via regions 200V. FIG. 7C also includes a metal region MR3 included in a third net of the IC.

In the embodiment depicted in FIG. 7C, distance RV corresponds to the number of tracks N=3.

FIG. 7D depicts metal region MR2 included in IC layout diagram 200L discussed above with respect to FIGS. 1-6. In the embodiment depicted in FIG. 7D, metal region MR2 is positioned such that two of the via locations are occupied by via regions 200V and a third via location between the via regions 200V corresponds to a forbidden position 200F discussed above with respect to FIGS. 1-6.

FIG. 8 depicts perpendicular tracks (not labeled) corresponding to tracks AT1-AT8 and BT1-BT8 discussed above with respect to FIGS. 1-6. In the embodiment depicted in FIG. 8, instead of a single pitch MAP in the Y direction, IC layout diagram 200L includes a first subset of tracks corresponding to a first pitch MAP1 and a second subset of tracks corresponding to a second pitch MAP2.

A sum of two instances of pitch MAP1 and five instances of pitch MAP2 is equal to a first cell height CH1, and a sum of two instances of pitch MAP1 and two instances of pitch MAP2 is equal to a second cell height CH2. Pitches MAP1 and MAP2 differ by an amount less than a manufacturing tolerance whereby positioning of via regions 200V is not affected by the corresponding offsets in track locations.

Decreasing values of the manufacturing tolerance correspond to decreasing feature sizes of a given manufacturing process, smaller values thereby corresponding to increasingly advanced processes. In some embodiments, the manufacturing tolerance has a value ranging from 2 nm to 15 nm. In some embodiments, the manufacturing tolerance has a value ranging from 3 nm to 10 nm.

In some embodiments, pitches MAP1 and MAP2 correspond to metal tracks in a second metal layer, and a metal zero layer includes first and second pitches corresponding to pitches MAP1 and MAP2, respectively. The first metal zero pitch corresponds to power supply connections to cells having cell heights CH1 and CH2, and the second metal zero pitch corresponds to signal connections to the cells.

By including two track subsets having different pitches in IC layout diagram 200L, the embodiment depicted in FIG. 8 is capable of having increased signal routing flexibility compared to embodiments that do not include track subsets having different pitches.

Figure 9:
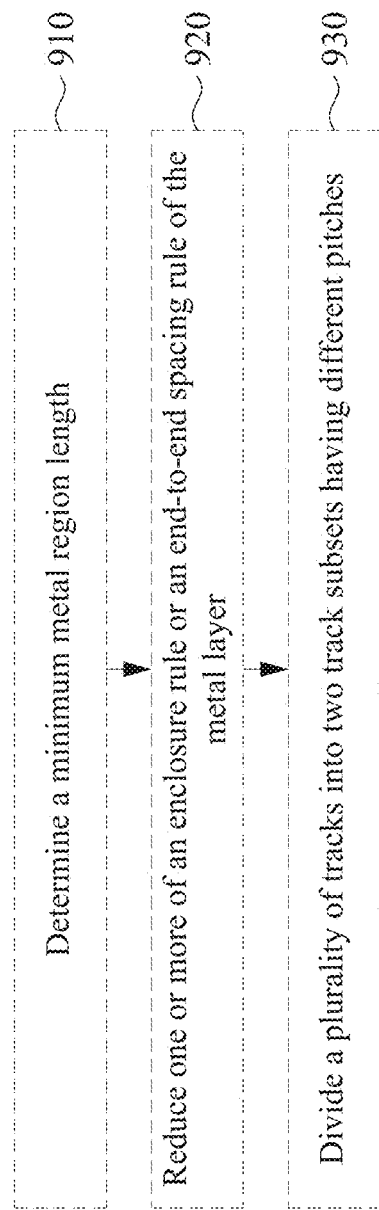
FIG. 9 is a flowchart of a method of applying a metal rule, in accordance with some embodiments.

FIG. 9 is a flowchart of a method 900 of applying a metal rule, in accordance with some embodiments. Method 900 corresponds to the embodiments depicted in FIGS. 7A-8 and is usable as some or all of operation 340 of method 300 discussed above with respect to FIG. 3.

At operation 910, in some embodiments, a minimum metal region length is determined based on a number of via locations in the metal region, a via width, e.g., via width VW, and a via enclosure, e.g., via enclosure VE. The number of via locations in the metal region is limited to a value ranging from one to four. Spacing of via regions positioned at the via locations is further based on an end-to-end spacing, e.g., end-to-end spacing E2E.

In some embodiments, the metal region extends in a cell height direction, and the minimum metal region length is limited to a value less than a cell height.

At operation 920, in some embodiments, the minimum metal region length is reduced by reducing one or more of an enclosure rule, e.g., via enclosure VE, or an end-to-end spacing rule, e.g., end-to-end spacing E2E, of the metal layer.

At operation 930, in some embodiments, one or both of first or second pluralities of tracks corresponding to two adjacent layers are divided into two track subsets having different pitches, e.g., pitches MAP1 and MAP2.

By executing some or all of the operations of method 900, one or more metal rules are applied to one or both of the metal layers adjacent to the via regions whereby routing efficiency is improved compared to approaches in which such metal rules are not applied.

Figure 10:
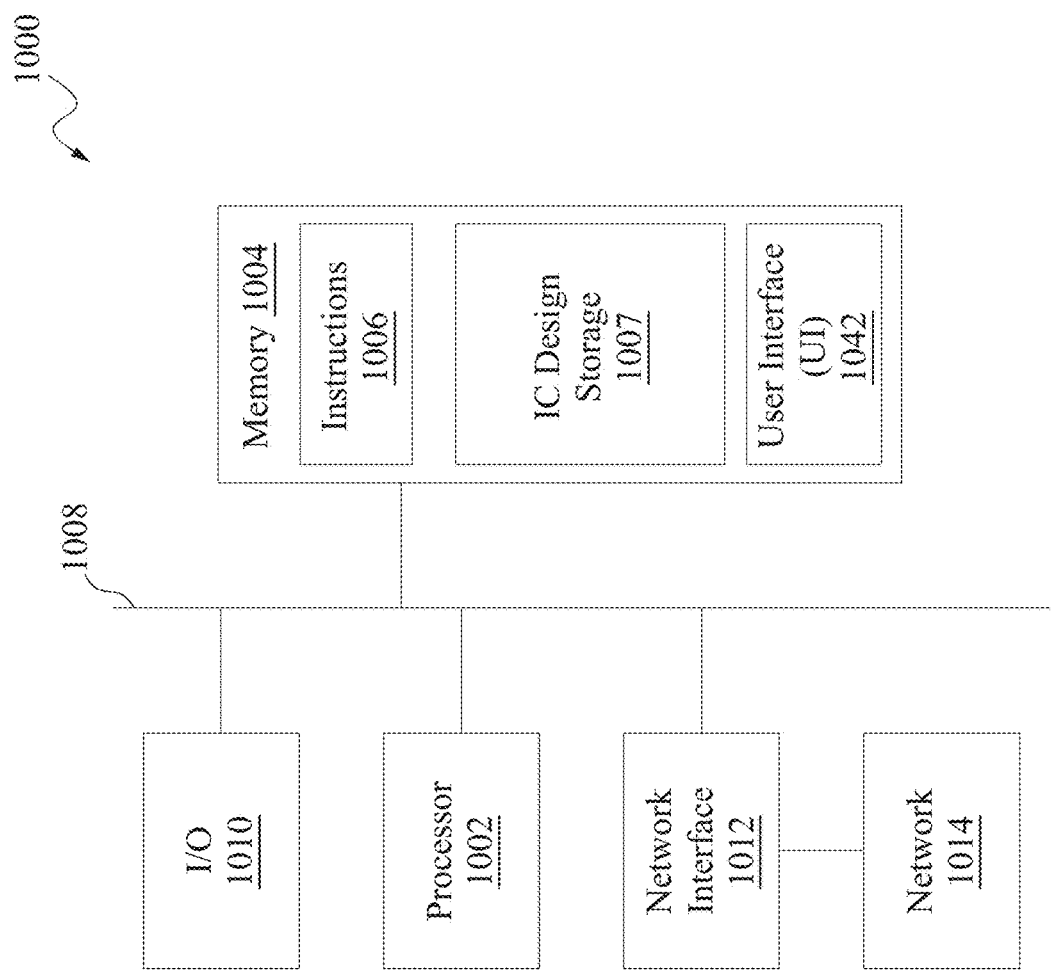
FIG. 10 is a block diagram of an IC design system, in accordance with some embodiments.

FIG. 10 is a block diagram of IC design system 1000, in accordance with some embodiments. Methods described herein of designing IC layout diagrams and/or fabricating IC photo masks in accordance with one or more embodiments are implementable, for example, using IC design system 1000, in accordance with some embodiments. In some embodiments, IC design system 1000 is an APR system, includes an APR system, or is part of an APR system, usable for performing an APR method, e.g., one or a combination of a constructive algorithm, an iterative algorithm, or an integrated algorithm.

In some embodiments, IC design system 1000 is a general purpose computing device including a hardware processor 1002 and non-transitory, computer-readable storage medium 1004. Storage medium 1004, amongst other things, is encoded with, i.e., stores, computer program code 1006, i.e., a set of executable instructions. Execution of instructions 1006 by hardware processor 1002 represents (at least in part) an EDA tool which implements a portion or all of a method, e.g., method 700 of generating an IC layout diagram described above (hereinafter, the noted processes and/or methods).

Processor 1002 is electrically coupled to computer-readable storage medium 1004 via a bus 1008. Processor 1002 is also electrically coupled to an I/O interface 1010 by bus 1008. Network interface 1012 is also electrically connected to processor 1002 via bus 1008. Network interface 1012 is connected to a network 1014, so that processor 1002 and computer-readable storage medium 1004 are capable of connecting to external elements via network 1014. Processor 1002 is configured to execute computer program code 1006 encoded in computer-readable storage medium 1004 in order to cause IC design system 1000 to be usable for performing a portion or all of the noted processes and/or methods. In one or more embodiments, processor 1002 is a central processing unit (CPU), a multi-processor, a distributed processing system, an application specific integrated circuit (ASIC), and/or a suitable processing unit.

In one or more embodiments, computer-readable storage medium 1004 is an electronic, magnetic, optical, electromagnetic, infrared, and/or a semiconductor system (or apparatus or device). For example, computer-readable storage medium 1004 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1004 includes a compact disk-read only memory (CD-ROM), a compact disk-read/write (CD-R/W), and/or a digital video disc (DVD).

In one or more embodiments, storage medium 1004 stores computer program code 1006 configured to cause IC design system 1000 (where such execution represents (at least in part) the EDA tool) to be usable for performing a portion or all of the noted processes and/or methods. In one or more embodiments, storage medium 1004 also stores information which facilitates performing a portion or all of the noted processes and/or methods. In one or more embodiments, storage medium 1004 includes IC design storage 1007 configured to store one or more IC layout diagrams, e.g., IC layout diagram 200L discussed above with respect to FIGS. 1-3.

IC design system 1000 includes I/O interface 1010. I/O interface 1010 is coupled to external circuitry. In one or more embodiments, I/O interface 1010 includes a keyboard, keypad, mouse, trackball, trackpad, touchscreen, and/or cursor direction keys for communicating information and commands to processor 1002.

IC design system 1000 also includes network interface 1012 coupled to processor 1002. Network interface 1012 allows IC design system 1000 to communicate with network 1014, to which one or more other computer systems are connected. Network interface 1012 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more IC design systems 1000.

IC design system 1000 is configured to receive information through I/O interface 1010. The information received through I/O interface 1010 includes one or more of instructions, data, design rules, libraries of standard cells, and/or other parameters for processing by processor 1002. The information is transferred to processor 1002 via bus 1008. IC design system 1000 is configured to receive information related to a UI through I/O interface 1010. The information is stored in computer-readable medium 1004 as user interface (UI) 1042.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by IC design system 1000. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 11:
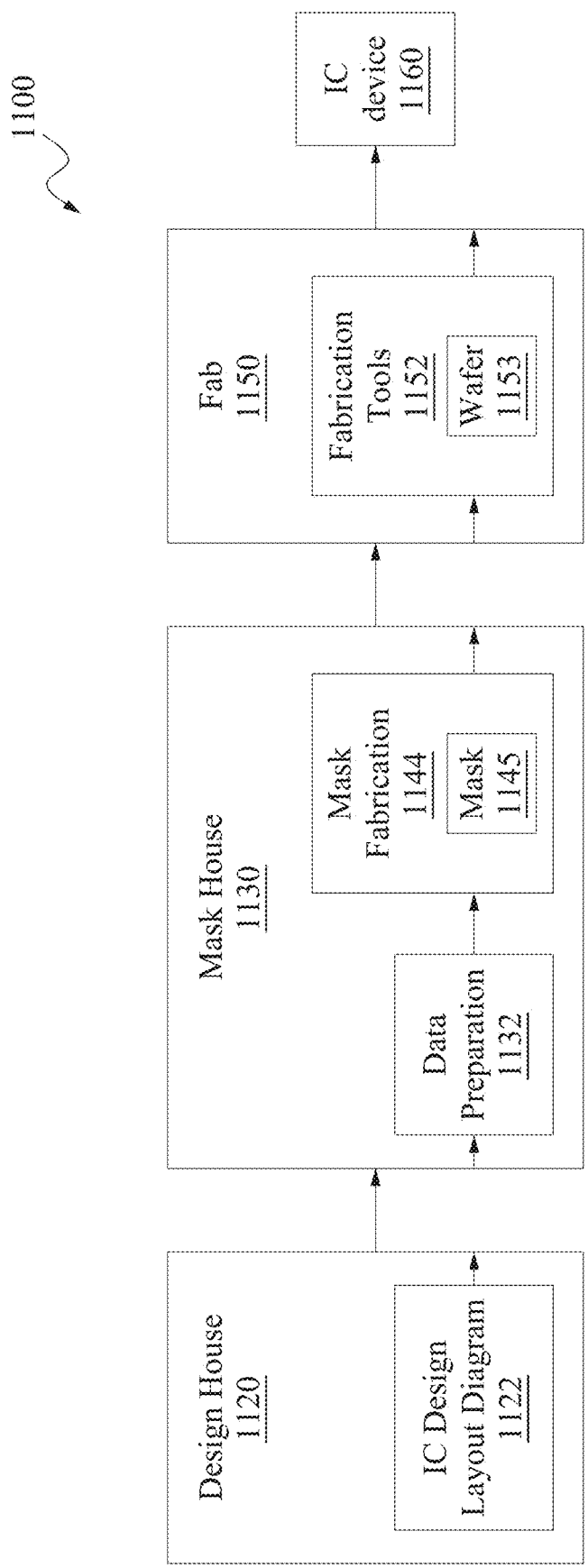
FIG. 11 is a block diagram of an IC manufacturing system, and an IC manufacturing flow associated therewith, in accordance with some embodiments.

FIG. 11 is a block diagram of IC manufacturing system 1100, and an IC manufacturing flow associated therewith, in accordance with some embodiments. In some embodiments, based on an IC layout diagram, at least one of (A) one or more semiconductor masks or (B) at least one component in a layer of a semiconductor integrated circuit is fabricated using IC manufacturing system 1100.

In FIG. 11, IC manufacturing system 1100 includes entities, such as a design house 1120, a mask house 1130, and an IC manufacturer/fabricator ("fab") 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns, e.g., an IC layout diagram discussed above. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 can be expressed in a GDSII file format or DFII file format.

Mask house 1130 includes data preparation 1132 and mask fabrication 1144. Mask house 1130 uses IC design layout diagram 1122 to manufacture one or more masks 1145 to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as mask (reticle) 1145 or a semiconductor wafer 1153. The design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 can be collectively referred to as mask data preparation.

In some embodiments, mask data preparation 1132 includes optical proximity correction (OPC) which uses lithography enhancement techniques to compensate for image errors, such as those that can arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which may undo part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated manufactured device is not close enough in shape to satisfy design rules, OPC and/or MRC are be repeated to further refine IC design layout diagram 1122.

It should be understood that the above description of mask data preparation 1132 has been simplified for the purposes of clarity. In some embodiments, mask data preparation 1132 includes additional features such as a logic operation (LOP) to modify the IC design layout diagram 1122 according to manufacturing rules. Additionally, the processes applied to IC design layout diagram 1122 during data preparation 1132 may be executed in a variety of different orders.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. Mask 1145 can be formed in various technologies. In some embodiments, mask 1145 is formed using binary technology. In some embodiments, a mask pattern includes opaque regions and transparent regions. A radiation beam, such as an ultraviolet (UV) or EUV beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 is an IC fabrication business that includes one or more manufacturing facilities for the fabrication of a variety of different IC products. In some embodiments, IC Fab 1150 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1150 includes wafer fabrication tools 1152 configured to execute various manufacturing operations on semiconductor wafer 1153 such that IC device 1160 is fabricated in accordance with the mask(s), e.g., mask 1145. In various embodiments, fabrication tools 1152 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multi-level interconnects, and the like (formed at subsequent manufacturing steps).

Details regarding an IC manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating an IC layout diagram includes obtaining a grid of intersecting first and second pluralities of tracks corresponding to adjacent metal layers, determining that first and second pitches of the respective first and second pluralities of tracks conform to a first rule, applying a via positioning pattern to the grid whereby via regions are restricted to alternating diagonal grid lines, positioning via regions at some or all of the grid intersections of the alternating diagonal grid lines, and generating the IC layout diagram including the via regions positioned along the alternating diagonal grid lines. In some embodiments, determining that the first and second pitches of the respective first and second pluralities of tracks conform to the first rule includes determining that at least one of the first or second pitches is less than a minimum via spacing rule. In some embodiments, determining that the first and second pitches of the respective first and second pluralities of tracks conform to the first rule includes determining that a ratio of a greater one of the first or second pitches to a lesser one of the first or second pitches is less than $\sqrt{3}$. In some embodiments, the first pitch is greater than the second pitch. In some embodiments, the first pitch corresponds to a first direction, and the second pitch corresponds to a cell height direction perpendicular to the first direction. In some embodiments, the first plurality of tracks corresponds to an upper metal layer of the adjacent metal layers, and the second plurality of tracks corresponds to a lower metal layer of the adjacent metal layers. In some embodiments, the alternating diagonal grid lines are a first set of alternating grid lines, and applying the via positioning pattern to the grid includes applying forbidden regions along a second set of alternating diagonal grid lines between the first set of alternating grid lines. In some embodiments, applying the forbidden regions includes applying forbidden positions at intersections of the first and second pluralities of tracks. In some embodiments, the method includes applying a metal design rule to a metal layer of the adjacent metal layers. In some embodiments, applying the metal design rule includes reducing one or more of an enclosure rule or an end-to-end spacing rule of the metal layer of the adjacent metal layers. In some embodiments, applying the metal design rule includes dividing the first or second plurality of tracks of the metal layer into two track subsets having different pitches. In some embodiments, the different pitches have a pitch difference less than a manufacturing tolerance value.

In some embodiments, an IC structure includes a plurality of first metal segments in a first metal layer of a semiconductor substrate, the plurality of first metal segments corresponding to first tracks, a plurality of second metal segments in a second metal layer of the semiconductor substrate adjacent to the first metal layer, the plurality of second metal segments corresponding to second tracks perpendicular to the first tracks, and a plurality of via structures configured to electrically connect the plurality of first metal segments to the plurality of second metal segments. Locations of intersections of the first and second tracks define a grid including a first plurality of diagonal grid lines alternating with a second plurality of diagonal grid lines, the first plurality of diagonal grid lines includes at least three via structures of the plurality of via structures positioned at contiguous intersection locations, and the second plurality of diagonal grid lines is free from including a via structure of the plurality of via structures. In some embodiments, the first tracks have a first pitch, the second tracks have a second pitch, and a ratio of the first pitch to the second pitch is less than $\sqrt{3}$. In some embodiments, the first pitch is greater than the second pitch. In some embodiments, the contiguous intersection locations are adjacent locations along a single grid line of the first plurality of diagonal grid lines. In some embodiments, the intersection locations have a spacing value ranging from 20 nm to 50 nm.

In some embodiments, a method of manufacturing a plurality of via structures includes providing an IC photo mask including via features and assist features positioned along alternating diagonal grid lines of a grid, aligning the IC photo mask with metal segments of a first metal layer of a semiconductor substrate, the metal segments having a spacing corresponding to a first pitch of the grid, performing one or more photolithography processes including the IC photo mask, thereby defining via structure locations corresponding to the via features, and forming via structures at the defined via structure locations. In some embodiments, the alternating diagonal lines of the grid correspond to intersections of first and second pluralities of metal lines having respective first and second pitches, the first pitch is greater than the second pitch, and a ratio of the first pitch to the second pitch is less than −3. In some embodiments, each of the assist features is a SRAF.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an integrated circuit (IC) layout diagram, the method comprising:
   obtaining a grid comprising grid intersections of first and second pluralities of tracks corresponding to adjacent metal layers;
   determining that first and second pitches of the respective first and second pluralities of tracks conform to a first rule;
   applying a via positioning pattern to the grid whereby via region placement is restricted to alternating diagonal grid lines;
   positioning via regions at some or all of the grid intersections of the alternating diagonal grid lines; and
   generating the IC layout diagram including the via regions positioned along the alternating diagonal grid lines.

2. The method of claim 1, wherein the determining that the first and second pitches of the respective first and second pluralities of tracks conform to the first rule comprises determining that at least one of the first or second pitches is less than a minimum via spacing rule.

3. The method of claim 1, wherein the determining that the first and second pitches of the respective first and second pluralities of tracks conform to the first rule comprises determining that a ratio of a greater one of the first or second pitches to a lesser one of the first or second pitches is less than $\sqrt{3}$.

4. The method of claim 1, wherein the first pitch is greater than the second pitch.

5. The method of claim 4, wherein the first pitch corresponds to a first direction, and the second pitch corresponds to a cell height direction perpendicular to the first direction.

6. The method of claim 4, wherein the first plurality of tracks corresponds to an upper metal layer of the adjacent metal layers, and the second plurality of tracks corresponds to a lower metal layer of the adjacent metal layers.

7. The method of claim 1, wherein
   the alternating diagonal grid lines are a first set of alternating grid lines, and
   the applying the via positioning pattern to the grid comprises applying forbidden regions along a second set of alternating diagonal grid lines between the first set of alternating grid lines.

8. The method of claim 7, wherein the applying the forbidden regions comprises applying forbidden positions at intersections of the first and second pluralities of tracks.

9. The method of claim 1, further comprising applying a metal design rule to a metal layer of the adjacent metal layers.

10. The method of claim 9, wherein the applying the metal design rule comprises reducing one or more of an enclosure rule or an end-to-end spacing rule of the metal layer of the adjacent metal layers.

11. The method of claim 9, wherein the applying the metal design rule comprises dividing the first or second plurality of tracks of the metal layer into two track subsets having different pitches.

12. The method of claim 11, wherein the different pitches have a pitch difference less than a manufacturing tolerance value.

13. A method of generating an integrated circuit (IC) layout diagram, the method comprising:
  obtaining a grid comprising grid intersections of first and second pluralities of tracks corresponding to adjacent metal layers, wherein the first and second pluralities of tracks have respective first and second pitches;
  confirming that one or both of:
    the first and/or second pitch is less than a minimum via spacing rule, or
    a ratio of a greater one of the first or second pitches to a lesser one of the first or second pitches is less than $\sqrt{3}$;
  applying a via positioning pattern to the grid whereby via region placement is restricted to alternating diagonal grid lines;
  positioning via regions at some or all of the grid intersections of the alternating diagonal grid lines; and
  generating the IC layout diagram including the via regions positioned along the alternating diagonal grid lines.

14. The method of claim 13, wherein
the first pitch corresponds to a cell height direction, and the second pitch is greater than the first pitch.

15. The method of claim 14, wherein the first plurality of tracks corresponds to one of the adjacent metal layers overlying the other of the adjacent metal layers corresponding to the second plurality of tracks.

16. The method of claim 15, further comprising applying a metal design rule to the other of the adjacent metal layers.

17. The method of claim 16, wherein the positioning the vias regions comprises overlapping one or more metal regions of the other of the adjacent metal layers positioned based on the metal design rule.

18. A method of generating an integrated circuit (IC) layout diagram, the method comprising:
  obtaining a grid comprising grid intersections of first and second pluralities of tracks corresponding to adjacent metal layers;
  determining that first and second pitches of the respective first and second pluralities of tracks conform to a first rule;
  applying a via positioning pattern to the grid by applying a second rule forbidding placing via regions at potential via locations at intersections of the first and second pluralities of tracks, wherein the potential via locations correspond to a first set of diagonal grid lines;
  positioning via regions at some or all of the grid intersections of a second set of diagonal grid lines alternating with the first set of alternating diagonal grid lines; and
  generating the IC layout diagram including the via regions positioned along the alternating diagonal grid lines.

19. The method of claim 18, wherein the determining that the first and second pitches of the respective first and second pluralities of tracks conform to the first rule comprises one or both of:
  determining that at least one of the first or second pitches is less than a minimum via spacing rule, or
  determining that a ratio of a greater one of the first or second pitches to a lesser one of the first or second pitches is less than $\sqrt{3}$.

20. The method of claim 18, wherein the applying the second rule forbidding placing via regions at potential via locations comprises applying forbidden regions at the intersections of the first and second pluralities of tracks.

* * * * *